(12) United States Patent
Tour et al.

(10) Patent No.: US 6,430,511 B1
(45) Date of Patent: Aug. 6, 2002

(54) MOLECULAR COMPUTER (75) Inventors: James M Tour, Bellaire, TX (US);
Mark A Reed, Monroe, CT (US);
Jorge M Seminario, Columbia, SC
(US); David L Allara; Paul S Weiss,
both of State College, PA (US)

(73) Assignee: University of South Carolina,
Columbia, SC (US)

( * ) Notice: Subject to any disclaimer, the term of this patent is extended or adjusted under 35 U.S.C. 154(b) by 0 days.

(21) Appl. No.: 09/488,339

(22) Filed: Jan. 20, 2000

Related U.S. Application Data (60) Provisional application No. 60/116,714, filed on Jan. 21, 1999.

(51) Int. Cl.[7] .................. G01N 33/48; G06F 19/00; G06F 13/00; G06F 9/00; C12Q 1/68
(52) U.S. Cl. .................. 702/19; 702/20; 702/22; 435/6; 435/7.1; 703/13; 703/14; 703/15; 703/16; 708/1; 708/100; 710/100; 712/1; 713/1; 716/1
(58) Field of Search .................. 702/19, 20, 22; 435/6, 7.1; 536/25, 3; 530/333; 703/13, 14, 15, 16; 708/1, 100; 710/100; 712/1; 713/1; 716/1

(56) References Cited

U.S. PATENT DOCUMENTS

| 4,144,561 | A | * | 3/1979 | Tu et al. ...................... 364/200 |
| 5,276,893 | A | * | 1/1994 | Savaria ...................... 395/800 |
| 5,561,071 | A | * | 10/1996 | Hollenberg et al. ............. 437/1 |
| 5,629,231 | A | | 5/1997 | Kiehl ...................... 438/509 |
| 5,751,683 | A | | 5/1998 | Kley ...................... 369/126 |
| 5,780,613 | A | | 7/1998 | Letsinger et al. ........ 536/25.33 |
| 5,787,032 | A | | 7/1998 | Heller et al. ................ 365/151 |
| 5,789,940 | A | | 8/1998 | Taddiken ...................... 326/60 |
| 5,804,373 | A | | 9/1998 | Schweitzer et al. ............ 435/6 |
| 5,835,772 | A | | 11/1998 | Thurlo ...................... 395/705 |
| 5,847,565 | A | | 12/1998 | Narayanan ................... 324/322 |

OTHER PUBLICATIONS

Drexler, K. Eric "Nanotechnology" Internet Dec. 23, 1998 http:nano.xerox.com/nano/.

(List continued on next page.)

Primary Examiner—Ardin H. Marschel
(74) Attorney, Agent, or Firm—Michael A. Mann; Nexsen Pruet Jacobs & Pollard LLC (57) ABSTRACT A molecular computer is formed by establishing arrays of spaced-apart input and output pins on opposing sides of a containment, injecting moleware in solution into the containment and then allowing the moleware to bridge the input and output pins. Moleware includes molecular alligator clip-bearing 2-, 3-, and molecular 4-, or multi-terminal wires, carbon nanotube wires, molecular resonant tunneling diodes, molecular switches, molecular controllers that can be modulated via external electrical or magnetic fields, massive interconnect stations based on single nanometer-sized particles, and dynamic and static random access memory (DRAM and SRAM) components composed of molecular controller/nanoparticle or fullerene hybrids. The current-voltage characteristics that result from the bridging between input and output arrays can be ascertained using another computer to identify the bundles of inputs and corresponding outputs that provide a truth table for the specific functions of the computer.

33 Claims, 8 Drawing Sheets

OTHER PUBLICATIONS

Author Unknown "LMR–Current Research" Internet Dec. 23, 1998 http://lipari.use.edu/~lmr/html/research.html.

Schall, et al., "Prediction of Structural, Electronic and Electrical Properties of Strained Fullerence Nanotubules: Implication for Nanoscale Device Design" Internet Dec. 23, 1998 http://www.forsight.org/Conferences/MNT6/Abstracts/Brenner/index.html.

Ventra, et al. "AB–Initio Simulation of Molecular Devices" Internet Dec. 23, 1998 http://www.foresight.org/Conferences/MNT6/Abstracts/DiVentra/index.html.

Che, et al "Studies of Fullerenes and Carbon Nanotubes by an Extended Bond Order Potential" Internet Dec. 23, 1998 http://www.foresight.org/Conferences/MNT6/Abstracts/Cagin3/index.html.

Ellenbogen, James C. "Architectures for Molecular Electronic Computer Logic" Internet Dec. 23, 1998 http://foresight.org/Conferences/MNT6/Abstracts/Ellenbogen/index.html.

El–Shall, M. Samy "Synthesis of Semiconductor and Metal Oxide Nanoparticles by Laser Vaparization–Controlled Condensation Techniques" Internet Dec. 23, 1998 http://www.foresight.org/Conferences/MNT6/Abstracts/El–Shall/index.html.

Emberly, Eldon "Electrical Conductance of Molecular Wires" Internet Dec. 23, 1998 http://www.foresight.org/Conferences/MNT6/Abstracts/Emberly/index/html.

Erokhin, et al. "Semiconductor Nanostructure Prepared from Langmuir–Blodgett Organi Precursors" Internet Dec. 23, 1998 http://www.foresight.org/Conferences/MNT6/Abstracts/Erokhin/index.html.

Fritzsche, et al. "Electrical Characterization of Nanowires Created by Metallization of a Biological Template" Internet Dec. 23, 1998 http://www.foresight.org/Conferences/MNT6A/Abstracts/Fritzsche/index.html.

Hall, J. Storrs "Architectural Considerations For Self–Replicating Manufacturing Systems" Internet Dec. 23, 1998 http://www.foresight.org/Conferences/MNT6/Abstracts/Hall/index.html.

Hogg, Tad "Robust Self–Assembly using Highly Designable Structures" Internet Dec. 23, 1998 http://www.foresight.org/Conferences/MNT6/Abstracts/Hogg/index.html.

Hutchison, et al. "Assembling Nanoelectroinic Structures From Biomolecular Templates and Chemically Modified Nanoparticles" Internet Dec. 23, 1998 http://www.foresight.org/Conferences/MNT6/Abstracts/Hutchison/index.html.

Nicolini, et al. "Towards Computational Nanotechnology Based On Protein Automata" Internet Dec. 23, 1998 http://www.foresight.org/Conferences/MNT6/Abstracts/Nicolini/index.html.

Weick, Manfred "Fifty Years After Claude Shannon: How the Path From Micro–to Molecular electronics is Being Determined by Biology, Information Technology, Computer Architecture, Materials and Applications" Internet Dec. 23, 1998 http://www.foresight.org/Conferences/MNT6/Abstracts/Weick/index.html.

Drexler, K. Eric *Nanosystems: Molecular Machinery, Manufacturing, and Computation* Internet Dec. 23, 1998 http://www.forsight.org.Updates/Update 15.6.html.

* cited by examiner

MOLECULAR COMPUTER

PRIORITY STATEMENT

We claim the benefit of the priority date of U.S. Provisional Patent application No. 60/116,714, filed Jan. 21, 1999, which is incorporated herein by reference.

FIELD OF THE INVENTION

The present invention relates generally to computer architecture, and, more specifically to a computer that uses molecules as functional units (e.g. logic gates and memory cells).

BACKGROUND OF THE INVENTION

The investment by society in computer technology has been astonishing in both its rate of increase and its extent. In less than three decades, the personal computer, for example, has gone from experimental prototype to being an essential tool of business. Demands for computers with greater and greater capabilities to perform more and more tasks continue unabated. Heretofore, better computers have resulted from increased miniaturization, among other improvements.

Presently, however, we do not have a viable technology for our near future computer needs. Although Moore's law (an accurate empirical law at this time) predicts the doubling of computer power every 18 months, this trend cannot continue. Digital computers are presently based on silicon technology. More precisely, very large scale integration (VLSI) is a lithographic technology, and although silicon is indeed quite important, Moore's Law is essentially lithography driven. The law of diminishing returns will eventually conquer Moore's Law, perhaps by 2005, when the cost of an integrated-circuit fabrication factory will become exorbitant and spell the demise of the growth of VSLI-based computer systems.

Other than standard logic and memory tasks, a technique one might choose for an ideal post-VLSI computer system would be to utilize a non-lithographic approach to construction, e.g., a directed self-assembly, so there would either be a vast redundancy or the system should have fault tolerance through dynamic fault reduction. Another property for such a computer would be an ability to be self-reconfigurable, that is, it should be able to dynamically reconfigure interconnects in response to inputs, or else it will also fall victim to the incessant demands for interconnects. Finally, this post-VLSI computer would be innovative: able to reconfigure architectures not previously experienced.

There remains a need, therefore, for a new computer technology that provides the advantages of self-assembling construction and greater processing capability that can be reconfigured readily.

SUMMARY OF THE INVENTION

The present invention is a device having a multiplicity of input pins and a multiplicity of output pins on its external surface. The interior is composed of a self-assembled array of specifically selected and adapted molecules, called "moleware", bridging the inputs and outputs. Initially, this present computer is in a blank state; that is, nothing is known about the electrical-signal-transferring relationship between the input and output pins. A voltage is applied to each of a series of bundles of inputs. The outputs are searched, also in bundles, to determine what outputs have signals running through them. Using a computer to do the searching, sets of bundles of inputs and outputs will eventually be identified that can be used to constitute a truth or partial truth table for the computer. Electrical or magnetic fields can also be applied across the container to increase configuration possibilities.

The present invention, in a preferred embodiment, may take the form, for example, of a one cubic centimeter box that contains 1000 metallic inputs (m), 1000 outputs (n), and 100 different learning inputs (l). The box will contain an intelligently self-assembled array of $10^{20}$ pre-designed active and passive components ("moleware") including molecular alligator clip-bearing 2-, 3-, and molecular 4-terminal wires, molecular resonant tunneling diodes, molecular switches, molecular controllers that can be controlled via external electrical or magnetic fields, massive interconnect stations based on single nanometer-sized particles, dynamic or static random access memory (DRAM or SRAM) components composed of molecular controller/nanoparticle or fullerene hybrids. Moreover, the present molecular computer, once formed, can be further modified by new interconnect routes via electrochemically induced cross linking of the nanoparticles or by "burning out" components through large induced fields, analogous to the operation of a field programmable gate array (FPGA). Arrays of these molecular computers can be coupled using standard interconnect methods to form massive molecular computer arrays.

The present molecular computer has a number of advantages:

It can be teachable. The system can be trained by forcing the correct output for a given input by varying the operational inputs until consistency is achieved. The output as a function of input can be autoverified.

It can be reconfigurable. Either by successive retraining or by burning out specific functions, the system can be changed.

It can possess logic. The truth table for the molecular computer would not be known a priori, but would be determinable once it has been prepared or on the fly as self-assembly takes place.

It can possess memory. Semiconductor nanoparticles such as CdS or CdSe coated with molecular control elements, or $C_{60}$ surrounded by controller elements, or even nanometer-scale metallic particles sufficiently small so as to exhibit sizeable Coulomb blockade, will be preformed and then permitted or induced to assemble themselves as part of the network of the present molecular computer. In the situation where an electromagnetic field is applied, the controllers will open thereby permitting the semiconductive or metallic particle to store a charge, hence acting as a DRAM or SRAM component.

It will have an intrinsic extremely high fault tolerance because of the ability to use their terminals (input, outputs, and learning inputs) as rewiring control leads. Therefore, this embodiment takes advantage of the immense number of functions that can be make with their terminals. For example, for binary operation, 1000 inputs yield $2^{1000}$ posible input combinations. Therefore with 1000 possible outputs yield a total of $10^{32256000\ldots 0000}$ where the number of digits in the exponent is 304.

The system has dynamic fault reduction capabilities. Unlike VLSI, where the interconnect structure is rigid, the present molecular computer can be reprogrammed to eliminate undesired and inoperative fragments since the interconnect topology can be rewired at any time by applying sufficiently strong fields to regions of the molecular computer where reprogramming is desired.

The system lends itself to expansion. Arrays of molecular computers according to the preferred embodiment described above can be formed using standard interconnect methods to form massive computer arrays.

It is also possible to program the present computer in other than a binary digital mode, such as for example, an analog or multilevel (semi-analog) system. Perhaps programming becomes more formidable; however, data storage increases significantly and makes the programming challenges acceptable for certain applications.

The design of a molecular computer according to a preferred embodiment of the present invention takes into consideration that a very large percent of the fabricated moleware components may be defective. Hence, the testing will be more extensive and done in multiple stages in the fabrication and assembly. Molecular computers made according to the present it process will be tested individually and in place. Testing is performed preferably with a high-speed computer or supercomputer initially or, eventually, with the present molecular computer, due to the computational demands for rapidly sorting out the relationship between input and output pins.

An important feature of the present invention is that, unlike other approaches to making computers from molecules, specific placement of nanometer-sized molecular elements is not needed. Moleware is simply added in bulk in a dilute solution and given a chance to form links or "bridges" between inputs and outputs. The excess solvent is removed leaving the moleware components after self-assembly. Additionally, the moleware can be inserted using an evaporation process wherein the molecules are evaporated into the container wherein they self-assemble. The moleware is selected and adapted to form stable links that will remain in place during normal operating conditions. The molecular computer has then produced inputs and outputs with the necessary relationships; it remains the task of another computer to find which groups of input pins have what relationship to which output pins. Once the input and output pin relationships have been identified, the computer can then be used just as surely as if the moleware had been put carefully into position.

Another important feature of the present invention is that, because the present moleware is capable of transferring voltages comparable to current integrated circuits, the adaptation required to integrate molecular computers into current electronic devices is straight-forward.

Still another important feature of the present invention is that it is highly fault tolerant. Because there are vast numbers of molecular paths that are possible between inputs and outputs, it will not matter if a very large percentage of them do not work. Enough of them will work to permit a truth table to be found.

Another important feature of the present invention is the ability to reconfigure it—to increase, change or break connections in the bridging between inputs and outputs—simply by subjecting it to electrical or magnetic fields long enough and strong enough to cause the moleware to realign itself. These fields can be sufficiently local so as not to affect all moleware in the container.

Still another feature of the present invention is that, although each computer will be unique, all can be "trained" to perform the same functions once the necessary relationships between inputs and outputs are found.

Other features and their advantages will be apparent to those skilled in the art of nanotechnology and molecular computers from a careful reading of the Detailed Description of Preferred Embodiments accompanied by the following drawings.

DETAILED DESCRIPTION OF THE DRAWINGS

In the drawings.

DETAILED DESCRIPTION OF PREFERRED EMBODIMENTS

Figure 1A:
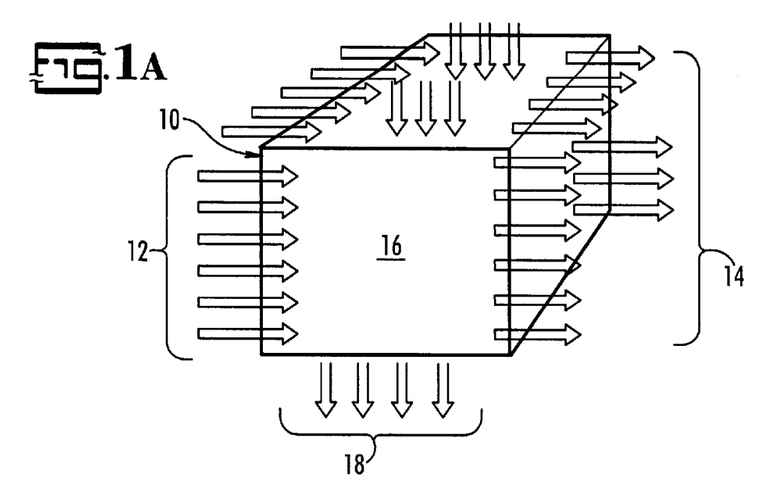
FIG. 1A illustrates in schematic form a molecular computer according to a preferred embodiment of the present invention.
Figure 1B:
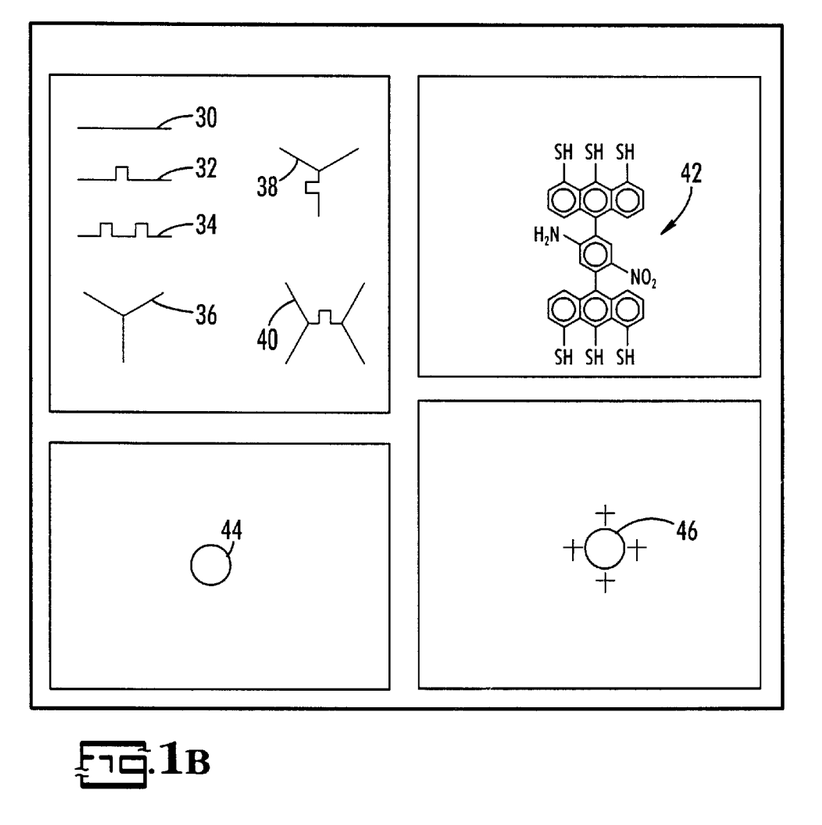
FIG. 1B illustrates four species of moleware for use inside the containment of the molecular computer.

FIGS. 1A and 1B illustrates the configuration of a molecular computer according to a preferred embodiment of the present invention. The computer comprises a containment, illustrated here in the form of a container 10 with input 12 and output ports 14 (I/O ports) and moleware 16 assembled inside the containment. The shape of container 10 is not critical as long as it provides acces to input ports 12 and output ports 14. Current or a field gradient 18 may be applied across container 10. Additionally, a two-dimensional chip-based scheme could be used wherein moleware branches laterally across I/O locations. The term "moleware" is intended to refer to nanometer-scale objects (less than 1000 nanometers in diameter) that serve as part of a computing device; i.e., nanometer-scale computer "hardware" (see FIG. IB). In general, moleware consists of molecules, clusters of molecules, nanoclusters of atoms, and combinations of these, selected for particular characteristics and adapted to interconnect in specific ways. The moleware is preassembled in standard chemical lab ware containers, preferably in dilute solutions, and is injected into the containment in a controlled sequence that allows the moleware to bridge the input and output ports. The supporting matrix for the input and output pins could be a rectilinear two or three dimensional grid fabricated on substrates made, for example, of glass or silicon. However a substrate-less approach is also possible. The three-dimensional grid can be formed using multilevel fabrication and micro-electromechanical release structures, and moleware can be deposited by evaporation.

Nominally, the present computer can be made, for example, of a one cubic centimeter containment with 1000 input and 1000 output metalic leads. The exact shape of the computer and the number of leads is not critical. All leads, for example, can be on the same side of the containment. The moleware will comprise an intelligently assembled array of about $10^{20}$ predesignated active and passive components, called herein "moleware", including molecular alligator clip-bearing 2-terminal wires 30; a 2-terminal wire with a molecular resonant tunneling diode 32; 2-terminal wires with an incorporated quantum well 34; 3- terminal wires 36; 3-terminal wires 38 with molecular resonant tunneling diodes; 4-terminal wires with molecular resonant tunneling diodes 40 (with-diode-version only shown), molecular controllers 42 that can be modulated via the external peripheral fields, massive interconnect stations based on single gold or silver nanoparticles 44, DRAM components 46 composed of molecular controller/nanoparticle or fullerene hybrids in an inert atmosphere, preferably argon or nitrogen. Moreover, the present molecular computer, once formed, can be further modified by new interconnect routes via electrochemically-induced crosslinking of the nanoparticles or by "burning out" components through large induced fields, analogous to the operation of a field programmable gate array (FPGA). Adding, deleting and changing the bridges from input to output pins alters the selection of relationships between the input and output pins.

Initially the system is in a blank state, with random interconnects yielding generally meaningless output for a given input. The system is then trained, that is, taught new logic functions by forcing the correct output n for a given input m (i.e., an n(m) function) by varying the inputs I until stability is achieved. The goal of self-reconfigurability implies that one sacrifices control over detailed reconfiguring: it is not necessary to know the exact interconnect structure in order to give the correct relationship between input and output. The system then functions as a molecular computer. Furthermore, it does not necessarily have to operate in a binary mode. Use of hexadecimal or analog modes, for example, would vastly increase the information storage density at the expense of increased programming demands.

During the assembly, the computer will be connected using the I/O leads. After the assembly process, the computer will be interfaced via the metallic input and output pins of the molecular computer via normal lithographic wiring. For each logical component, an I/O determination routine will be executed up to the point that a usable truth table is obtained for a desired operation. To decrease the number of individual single bit I/O combinations to be tested, I/O tests can be bundled, thereby decreasing the number of I/O testing combinations while increasing the chances of overcoming single fault locations. To determine single fault locations, subcircuits can be tested in aggregate.

More complex, analog responses can be measured as well (a hybrid on-chip multiplexer can be incorporated as necessary) to allow approximation of the numerical parameters associated with the signal thresholds and response curves and to develop and refine software models of the performance of working moleware. This approach allows tuning of the manufacture of the moleware to increase yields of working components.

The programming of the molecular computer takes into account its architecture, and in particular (i) its very large number of components, (ii) its variable assembly process, and (iii) the incorporation of some components that are only partially functional.

The large number of components dictates that a modular programming approach wherein key functional modules are determined and separated for execution by the molecular computer. These modules are trained and tested. The variable assembly of the molecular computer permits a corresponding flexibility in programming. For example, if one wanted relatively more memory capability, more semiconductor nanoparticle/controller (DRAM) elements would be attached during the assembly process. Second, as with the FPGA, specific elements could be hard-wired into the final system by a burning out approach, just as is currently done with macroscopic field programmable arrays. Thirdly, new interconnect routes via electrochemically induced crosslinking of the nanoparticles can be achieved by adding, for example, pyrrole to form new wire interconnects between the particles by application of a potential for polypyrrole growth.

While the system will also be software programmable once a truth table pattern has been defined, incorporation of components wherein a portion of them are only partially functional requires that the programming of the present molecular computer to provide dynamic faults. The software needs the capability to detect faulty components on an on-going basis, and the programming will need to allow faulty components to be bypassed by other components. There is a large body of literature in the error-resilient programming techniques that may be employed. To facilitate the efficient detection and repair of faults, our software architecture for fault resiliency may be designed with a hierarchical structure and employ methods for re-assigning computations to reliable components.

The present molecular computer overcomes shortcomings of VLSI computers by pre-fabricating moleware, which is defined as molecular components such as RTDs and DRAMs, as well as molecular level interconnects based on molecular wires and junctions. Prefabrication is achieved by intelligent self-assembly strategies. In this context, "intelligent" means using preformed molecular components and knowing the order of additions for each component—typically, molecular wires first, then nanoparticles, then more molecular wires including wires with barriers. In that way, if one desired, a similar molecular computer can be constructed using the same sequence of moleware addition. However, just as with biological brains, no two molecular computers would be identical.

Figure 2A:
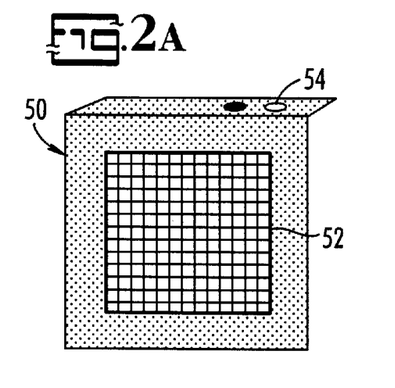
FIG. 2A illustrates in schematic form the inputs/outputs for a molecular computer according to a preferred embodiment of the present invention.
Figure 2B:
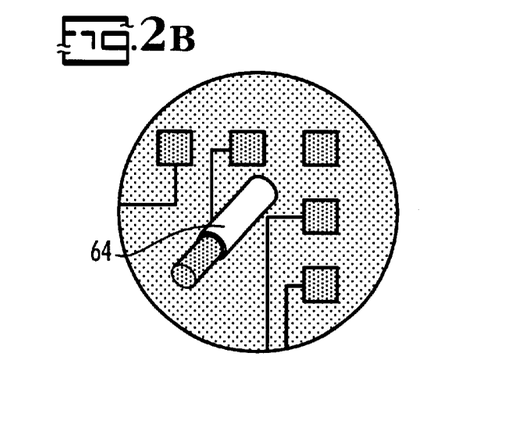
FIG. 2B illustrates a detailed perspective view of the inputs/outputs.
Figure 3:
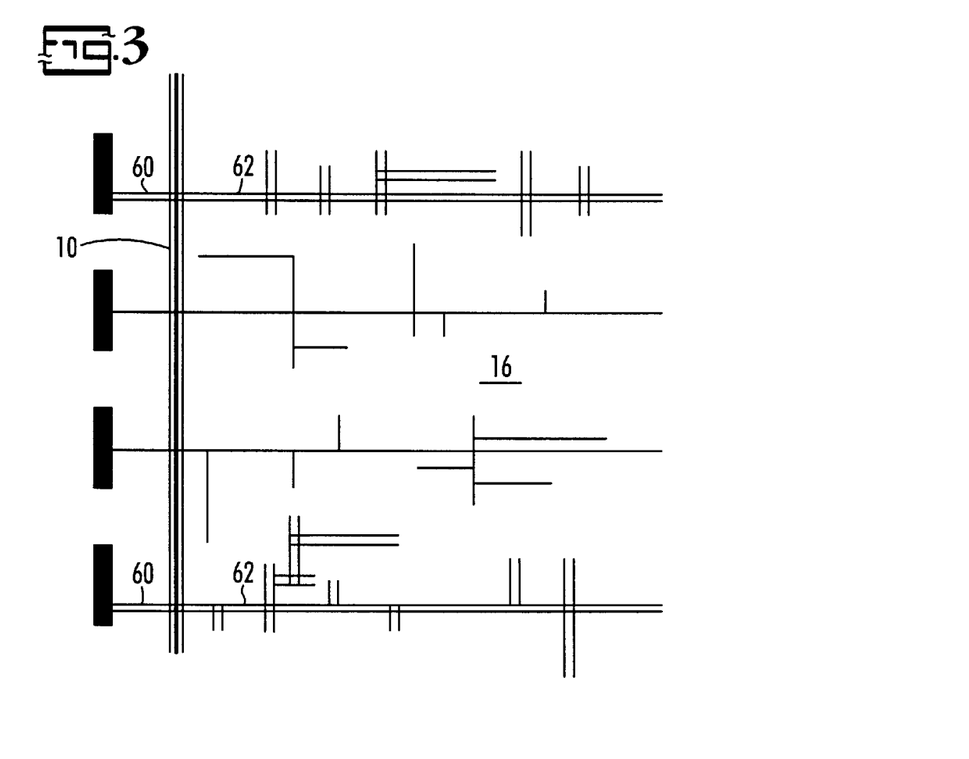
FIG. 3 illustrates a two-dimensional projection of a detail of a cross sectional view of the input/output arrangement, according to a preferred embodiment of the present invention.

FIGS. 2A, 2B and 3 illustrate the containment and pin array. The container 50 for the molecular computer may either contain or be directly fabricated from 2D rectilinear I/O grids 52 on a substrate and be approximately 1 centimeter on a side. Initially, there would be ports 54 for injection of organic solutions of moleware. There would preferably be 1000 pins 60 on each face for input and output. Any combination of the pins could be used for inputs 12 and outputs 14. The I/O routes could be interchanged as designed for a specific function. The interior portions 62 of the pins would be the binding sites to the initial moleware components in the intelligent self-assembly process, or be multi-branched electrodes (trees) that extend into the molecular computer. To provide more states, a multi-branched 3D electrode could have alternating and possibly a periodic regions, that may be exposed, to form complex nucleation topologies. The initial port 54 could be sealed after assembly is complete. Various electrode issues (metal, spacing, etc.) are within the capabilities of those with ordinary skill in the art without undue experimentation and can be determined on a microfabricated 2D chip with the candidate molecular computer moleware.

Along the periphery or through the container, field gradients can be introduced to control the DRAM segments. These are applied by macroscopic leads running through the interior of the box when higher gradients are to be used. Initially these are nested, insulated multi-branched 3D electrodes that provide the scaffolding for the moleware.

Figure 4:
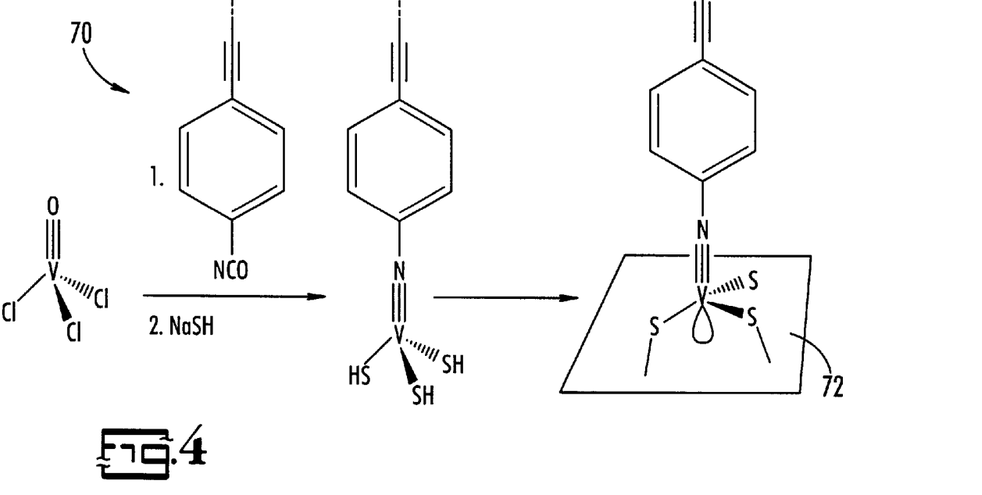
FIG. 4 illustrates in chemical symbols and schematic form the formation of molecular alligator clips on the end of molecular wires and its attachment by sulfur bonding to metal surfaces, according to a preferred embodiment of the present invention.
Figure 5:
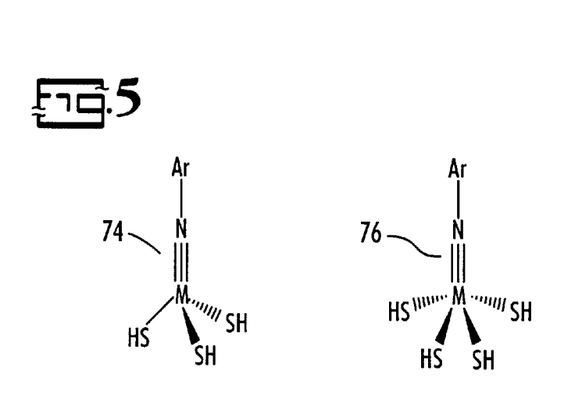
FIG. 5 illustrates two additional molecular alligator clips, according to alternative preferred embodiments of the present invention.
Figure 6:
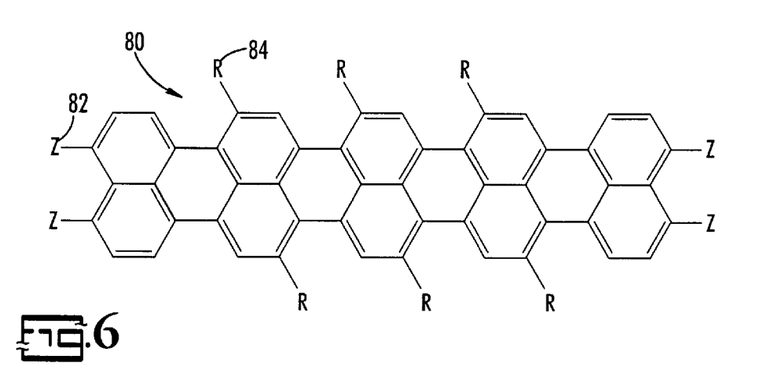
FIG. 6 illustrates in chemical symbols a molecular wire with alligator clips according to a preferred embodiment of the present invention.

FIGS. 4 through 11 illustrate alligator clips, molecular wires and their attachment to nanoparticles and other moleware used with the present invention. One type of molecular wire illustrated in FIG. 4, namely, a wire 70 with an isocyanate terminus that will interact with the empty $d_z^2$ orbital on vanadium 72 and the filled surface bands. FIG. 5 illustrates two other metal complexes, a tetrahedral complex 74 where "M" can be Vanadium, Niobium, or Tantalum, and a square pyramidal complex 76 where "M" can be Molybdenum or Tungsten, for use as a terminus. FIG. 6 illustrates a molecular wire 80 with "alligator clips" 82 (where "Z" can be, for example, SH, $SiCl_3$, $NV(SH)_3$) on each end with solubilizing groups 84 (where "R" can be, for example, $C_{12}H_{25}$) attached along the length of wire 80. "Alligator clip" means a device—here a molecule—that attaches one component to another, in an analogy to macroscopic spring biased "alligator" clips used in more traditional electronics to attach wires to terminals.

The molecular wires are constructed from oligo (phenylene ethynylene)s bearing thiol termini for alligator clips or more conductive planar oligomer segments, or even carbon or related nanotube structures. The wires can be varied in length, functionality, number of termini, etc. Ab initio calculations and one-dimensional simulations of these systems can be performed to determine their characteristics as molecular wires and termin.

The molecules that form the control moleware (FIG. 1B) are those that permit more or less current to flow through them, as modulated by a third electrode field, that will be produced by the field arrays in specific regions as needed. Gold, platinum and silver, perhaps in combination, provide excellent stations for massive interconnection of the assembly moleware, thereby making the contents more conductive and providing for network-like operation. Self-assembly techniques using bifunctional molecular wires can be used to cap the particles with active surface chemical groups that will electrically connect the particles to the device electrodes and to "bare" metal particles of selected sizes, thus forming controlled-geometry, conductive networks. The use of controller molecules in the capping step would add a switching capability to the network lines when external fields are applied.

Figure 8:
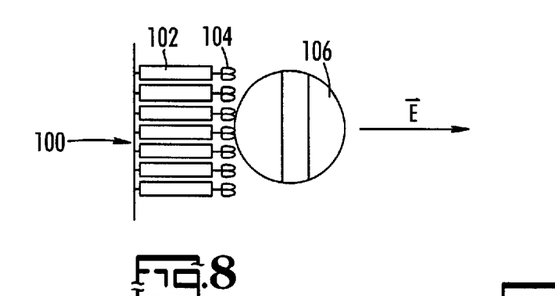
FIG. 8 illustrates the connection to a gold nanoparticle connected to an electrode via a bi-functional molecular wire, according to a preferred embodiment of the present invention.

Using semiconductor nanoparticles such as CdS and CdSe or even fullerenes, and decorating their surfaces with the controller molecules (FIG. 8) would permit the nanoparticles or fullerenes to act as switchable capacitors: charging in the presence of an applied field and retaining the charge once the field is diminished.

Figure 9:
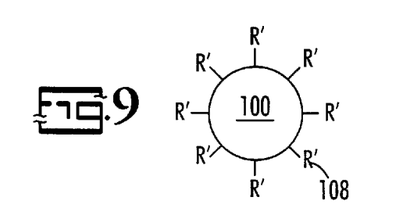
FIG. 9 illustrates a nanoparticle with connecting molecules attached to activate its surface and facilitate interconnection with other moleware, according to a preferred embodiment of the present invention.

Insulating oxides such as $Al_2O_3$, $TiO_2$, and $SiO_2$, will be surface capped with chemical groups for the selective interconnection to conductive metal particles (FIG. 9). These oxide particles thus act as high impedance resistors in the circuit. Control of the fractions of insulating particles in the self-assembling mixture will thus allow control of the total number of circuit connections up to the ultimate limit of the percolation threshold. Approaching this limit will impart exceedingly high sensitivity to the current-voltage characteristics across the individual I/O ports in the device.

Figure 12:
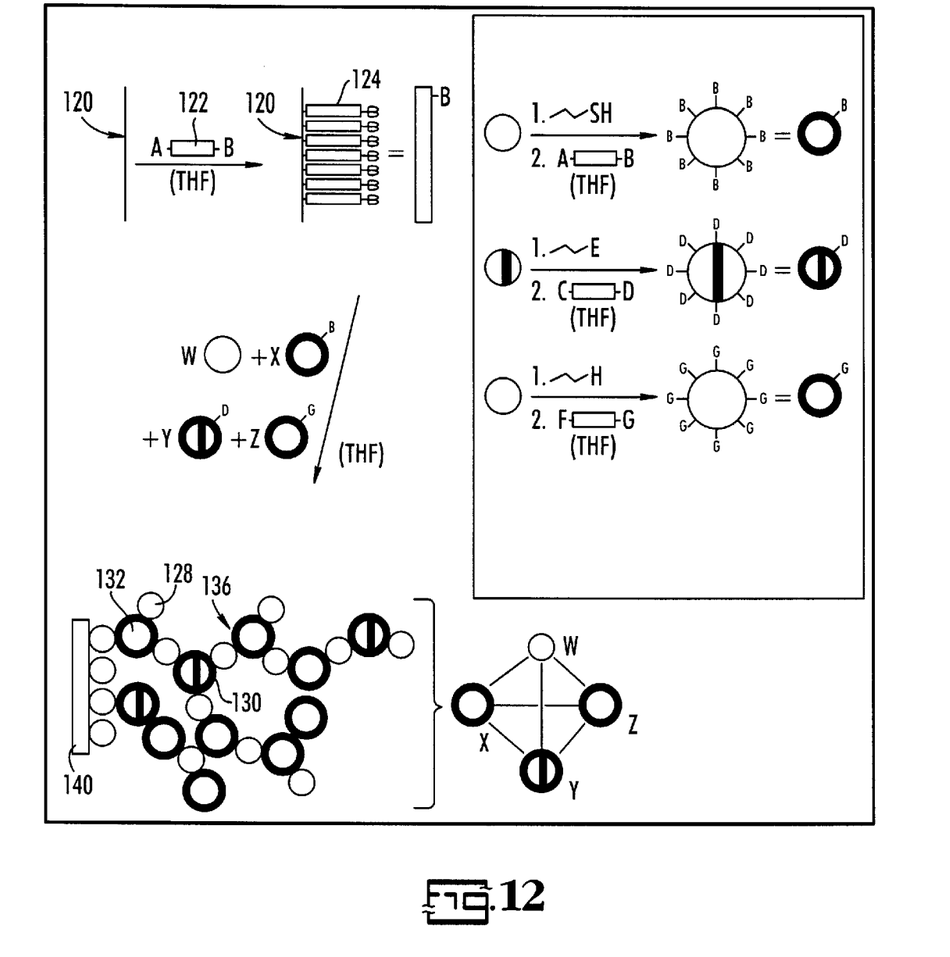
FIG. 12 illustrates modular preassembly of the moleware according to a preferred embodiment of the present invention.

All of the moleware: wires, junctions, DRAMs, etc., are synthesized prior to the intelligent self-assembly within the container, as seen in FIG. 12. One only needs to add them and permit the assembly as needed. If more memory elements are desired, for example, one simply adds more DRAMs. By varying the chemical nature of the surfaces of each type of nanoparticle through molecular capping techniques, the relative interconnection affinities of the molecular and nanoparticle components can be controlled thus providing a rational means to tune the final structure and functional states of the molecular computer. This strategy, together with the control of the relative amounts of components, their addition sequence and intermittent real-time feedback driven pulsing of the device I/O ports, form the key to the overall intelligent self-assembly approach. It will be clear that the order of addition of each species of moleware, the amount, the delay time before a second and a third species is added, will affect the development of the nature of the structure bridging the inputs and outputs. Although the bridges so formed will vary, the bulk of them will reflect the rationality of the sequence and a greater percentage will be usable than if all the moleware species were added at the same time. Field effect structures (molecules that change their orbital structures based on electric fields) could also be considered as moleware components.

The alligator clips for the moleware of the present microcomputer may be fabricated using metallic connection atoms in the series sulfur to selenium to tellurium, and others such as isonitrile, carboxylate (for adhesion to the native oxides of Titanium and Alumninum) and $SiCl_3$ (for adhesion to the native oxide on silicon). Alternatively, organo-transition metal species can be made using V, Nb, Ta, Mo, and W, which have an empty low-lying orbital projected toward the metallic surface which should respond as a gradient for the electron transport. Isocyaides are also useful in that they have a two-fold decrease in barrier height when attached to palladium with respect to thiols on gold. Thiols themselves bind well to Au, Ag, GaAs, PtIr and numerous other metallic surfaces. This would project the transition metal atom's empty $d_z^2$ orbital directly into the metal surface for interaction with the filled metal band (FIG. 4). This is a unique approach to make a system that is analogous to a gradient of charge in a solid state system wherein the gradient is used to solve the impedance mismatch problems.

As seen in FIG. 6, molecules will be functionalized with alligator clips in order to make direct chemical contacts with the I/O electrodes and nanocomponents, viz., nanoparticles, to which the molecules will be attached in functional chains. The chemical nature of the alligator clip groups will be optimized for chemical bonding selectivity to desired surfaces, bond stability and favorable electrical junction properties. The groups will be chosen from a set of precursors which will provide the following bonding units as needed: RS-, RSe-, RTe-, RNC-, $RCO_2$-, where R= the molecules to which the group is attached. This set allows good flexibility in terms of the possible groups but other groups are possible also such as $RPO_3H_2$, $RSiO_x$, and $RNH_2$, depending on the type of electrode or nanoparticle surface desired. The variety of groups goes well beyond the typical S-based ones previously used since these newer varieties includes attachments to insulator surfaces, in addition to the typical case of just Au electrodes used in the past. This extension requires no more than state of the art surface chemistry.

Molecular wires can be fashioned of oligomers, fully soluble, of precise length and with alligator clip connection points. Suitable materials for molecular wires include carbon nanotubes, which are highly conductive, planar polyphenylenes, polypyridines, polypyridines and polythiophenes.

Figure 7:
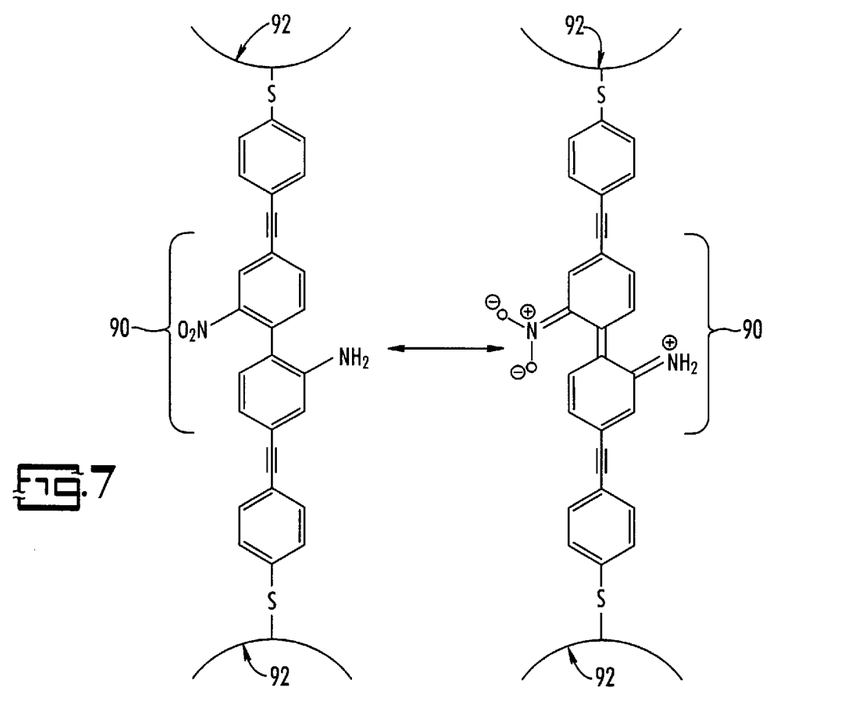
FIG. 7 illustrates a controller molecule in two orientations, in the "off" position on the left and in the conductive position on the right, according to a preferred embodiment of the present invention.

FIG. 7 illustrates a controller molecule 90 connecting two nanoparticles 92, illustrated in its two states ("on" and "off"). Controller molecules 90 are switched by an electric field. A donor/acceptor component on adjacent rings in an applied field stabilizes the zwitterionic form making it more planar. In this manner, the starting orientation to the applied field is irrelevant so no polling of the system during formation is required. This molecule would be analogous to a bi-polar switch in the "off" position, meaning negligible current would pass though the molecular chain. Once the field is applied, however, the central molecular element would switch to a more planar state with a smaller bandgap, and hence a more conducive configuration to enable current to flow.

The terms planar and perpendicular are not intended in the literal sense, only that the initial structure has a higher degree of twist than the latter structure. Hence electron transport will be more facile in the second structure. This is precisely what is needed for an electronic system. Note that DRAM systems generally are refreshed every $10^{-5}$ seconds, therefore, even slight electronic retardations are sufficient. The initial biphenylnitroamine moiety would reside in a less planar state than the zwitterionic structure. However, a perpendicular electric field component would stabilize the zwitterionic state, thereby making that form a greater contributor to the resonance forms. Once in that form, electronic passage should be more facile. Even if there were multiple molecules attached to the nanoparticle, as long as one became more planar in the applied field, electrons could be trapped on the nanoparticle and the field then diminished for information storage.

Gold, platinum and silver nanoparticles 100 provide excellent stations for massive interconnection of the assembly moleware, thereby making the contents more conductive and providing for network-like operation. Self-assembly techniques using bifunctional molecular wires 102, best illustrated in FIG. 8, can be used to cap the nanoparticle 100 with active surface chemical groups 104 that will electrically connect the nanoparticles to the device's electrodes 106 and to "bare" metal particles of selected sizes added to the interior of the containment, thus forming controlled geometry conducting networks. The use of controller molecules in the capping step would add a switching capability to the network lines when external fields are applied. This requires self-assembling, nanometer-scale components into strings or networks in which the various components are interconnected in various ways. The basic components consist of multiple alligator clip molecules, including both wires and controllers, and nanoparticles made from metals, semiconductors and insulators. The simplest structure is a nanoparticle, such as would be formed from a semiconductor, attached to an electrode by a bifunctional molecular wire. When a field is applied between the base electrode and a nearby electrode, this structure will act as a capacitor as charge is pulled into (or drawn out of) the semiconductor particle. A more complicated linear string would contain a field activated controller molecule and a semiconductor nanoparticle. These components could impart sophisticated properties to the string if appropriately connected between electrodes and placed so that local fields could be varied. Such strings, or 3-dimensional networks, will be formed in-situ so as to have a fraction attached to the I/O electrodes.

Nanoparticles 100 are synthesized in different sizes, from ~1.5 nm to ~500 nm, as required. The surfaces will be activated, as seen in FIG. 9, by various chemical connecting molecules 108 to facilitate the interconnections. The final hybrid assemblies will be made by simply mixing activated components in non-aqueous solvents. The metal nanoparticles primarily are made of gold and these are synthesized at controlled sizes using established methods. Other similar conductive metals such as Pt, Pd, and Ag can also be used. Attachment of molecules such as RS-, RSe-, RTe-, and RNC- uses current attachment chemistry techniques, where R is connecting molecule 108 with variations chosen to optimize surface bonding and junction impedances. For Pt, the same groups can be used. The nanoparticles 100 are most easily made in an aqueous solution. However, for assembling the hybrid structures, non-aqueous conditions must be used in order to maximize molecular solubilities. This is done by pre-functionalizing the nanoparticle surface with short, solubilizing alkanethiolate chains (~$C_4H_9$—) or other coordination groups to form capped structures. These moieties will be transferred to appropriate organic solvents such as THF in which the molecular wires or switches will be attached by insertion into the host alkanethiolate surface matrix on the nanoparticle. This strategy will also serve to orient the inserted molecule in an outward direction from the surface. Electroactive molecules can be placed onto the surface of Au particles in the 1–2 nm size range and thus give those particles electrochemical effects.

Figure 10:
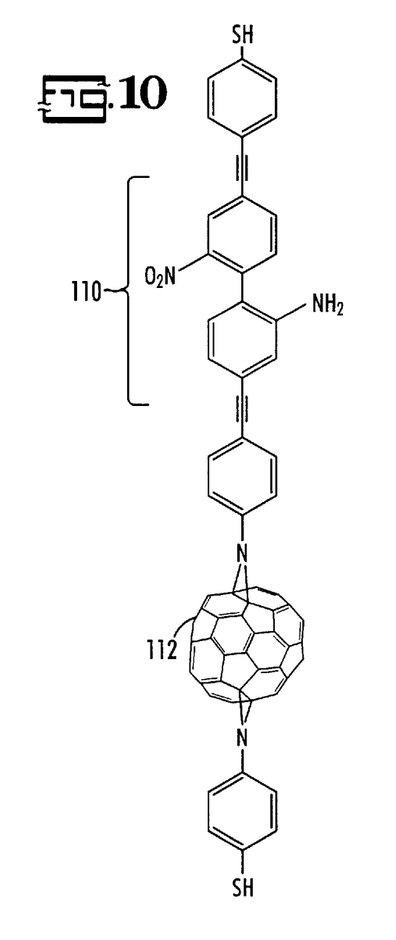
FIG. 10 illustrates a molecular dynamic random access memory composed of a molecular controller and molecular capacitor, according to a preferred embodiment of the present invention.

Referring now to FIG. 10, using semiconductor nanoparticles such as CdS and CdSe or fullerenes ($C_{60}$) 112 and decorating their surfaces with the controller molecules 110, would permit the nanoparticles and fullerenes to act as switchable capacitors: charging in the presence of an applied field and retaining the charge once the field is diminished. $C_{60}$ can be electrochemically reversibly charged with Lip to six electrons. The first four electrons are accepted with great facility (−0.98, −1.37, −1.87, and −2.37 volts vs. Fc/Fc+). Therefore, this could serve as an excellent molecular capacitor. The semiconductor particles consist primarily of metal chalcogenides, such as CdSe, CdTe, ZnSe, and ZnTe. The Cd-based nanoparticles are well-known and can be prepared with controlled sizes. Their synthesis and surface capping follows well-known established procedures. The surface functionalization of the chalcogenides involves primarily RS-, RSe-, and RTe- attachment groups. The electronic band structures of the capped nanoparticles and hybrid assemblies are probed using X-ray photoemission and optical spectroscopy. These particles can be attached to metal surfaces using self-assembly chemistry. For particles and hybrids assembled at surface, photoemission and spectroscopic ellipsometry are used. The physical structures can be examined by surface probes including STM and AFM and electron microscopes including TEM and high resolution SEM.

Figure 11:
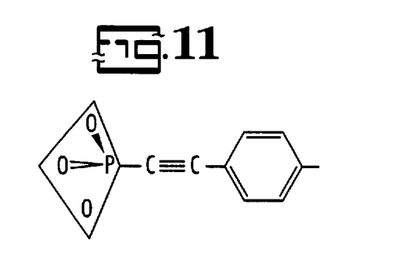
FIG. 11 illustrates a preferred insulator nanoparticle.

Insulating oxides, such as $Al_2O_3$, $TiO_2$, and $SiO_2$, are surface-capped with chemical groups for selective interconnection to conductive metal particles. These oxide particles act as high impedance resistors in the circuit. Control of the fractions of insulating particles in the self-assembling mixture will thus allow control of the total number of circuit connections up to the ultimate limit of the percolation threshold. Approaching this limit will impart exceedingly high sensitivity to the current-voltage characteristics across the individual I/O terminals in the device. The insulator nanoparticles are made using standard methods. Typically, $TiO_2$ and $Al_2O_3$ are used. The latter is desirable since hydrated $Al_2O_3$ surfaces can be very efficiently and selectively bonded and functionalized using organic acids such as $RCO_2H$ and $RPO_3H_2$. The phosphonic acids are useful since they form a "tripod" bonding to the surface which orients the adjacent part of the adsorbate perpendicular to the surface (see FIG. 11). $SiO_{2l}$ nanoparticles also make excellent insulator components but the best surface functionalization chemistry involves $SiO_x$ bonding which forms polymeric networks and is difficult to control. Other possible nanoparticles include $SnO_2$. Functionalization chemistry is available, for example, RS-chemistry developed for indium tin oxide electrodes transfers to $SnO_2$.

Modular pre-assembly of the moleware, illustrated in FIG. 12, is done prior to the intelligent self-assembly within the container. All components are added as needed and the assembly permitted. If more memory is desired, more DRAMs are added, for example. By varying the chemical nature of the surfaces of each type of component nanoparticle, the relative interconnection affinities of the molecular and nanoparticle components can be controlled, thus providing a rational means to tune the final structural and functional states of the present modular computer. This strategy, together with the control of relative amounts of components, their addition sequence and intermittent real-time feedback-driven pulsing of the device I/O ports, forms the key to the overall intelligent self-assembly approach.

For example, there are a variety of strategies for assembling the functional hybrid strings and networks. The general approach is to cap each nanoparticle 120 by a layer of bifunctional molecules 122 (where "A" is —SH). In the cases of metals and semiconductors where molecular wires 124 will be used, wires 124 must be oriented away from the nanoparticle's surface by insertion into a pre-assembled host monolayer of a short chain molecule. For insulators, the bifunctional molecules 122 can be insulating so that the precapping step is not necessary. The attachment groups A, C, F for a gold nanoparticle 120 will typically be A=–SX (X=H, Ac, etc.) or —NC for Au, C=SX(X=H, Ac, etc.) for CdSe, etc. and F=be —$CO_2H$ or $PO_3H$ for $Al_2O_3$. The surface termination groups will typically be B=A, D=C and G=A or C. A variety of starting nanoparticles 120 of different types, sizes and surface termination chemistry can be made. Varied relative amounts of desired types of the starting nanoparticles 120, including simple metal particles (e.g., Au with a "bare" surface), will be added, together and in sequences as desired, into a solvent containing a gold electrode surface functionalized with a molecular wire 124 terminated by B. Choosing surface terminations that attach to nanoparticle 120 will cause the mixture to interconnect in a statistical fashion both to itself in solution and to the Au electrode. These kinds of surface terminations will cause a network 136 to grow outward from the surface 140. A large number of possible paths will be produced which contain interconnections of metals 128, semiconductors 130 and insulators 132, thus generating a highly complex functional electrical network 136. Given the close proximity of neighboring base electrodes, network 136 will be established across the electrode gap forming a circuit connection, as illustrated in FIG. 12. Given the wide choices in the starting nanoparticle materials, their sizes, chemical terminations, the mixture compositions and mixing sequences, a huge variety of possibilities exists for controlling the statistical character of the network circuits. The next extensions of this strategy will include the addition of controller molecules to impart potential field-activated switching properties to the networks. The controller molecules can be added both by including them in the nanoparticle caps and by adding the molecules to the mixing solutions so that they become incorporated in the growing network. The structures of the networks assembled at single metal electrodes will be probed by elemental analysis (e.g., wet chemical techniques for the w, x, y, z stoichiometric factors), high resolution SEM, AFM and TEM (for cases of networks grown from surfaces such as SiO or C on TEM grids), and NMR.

Figure 13:
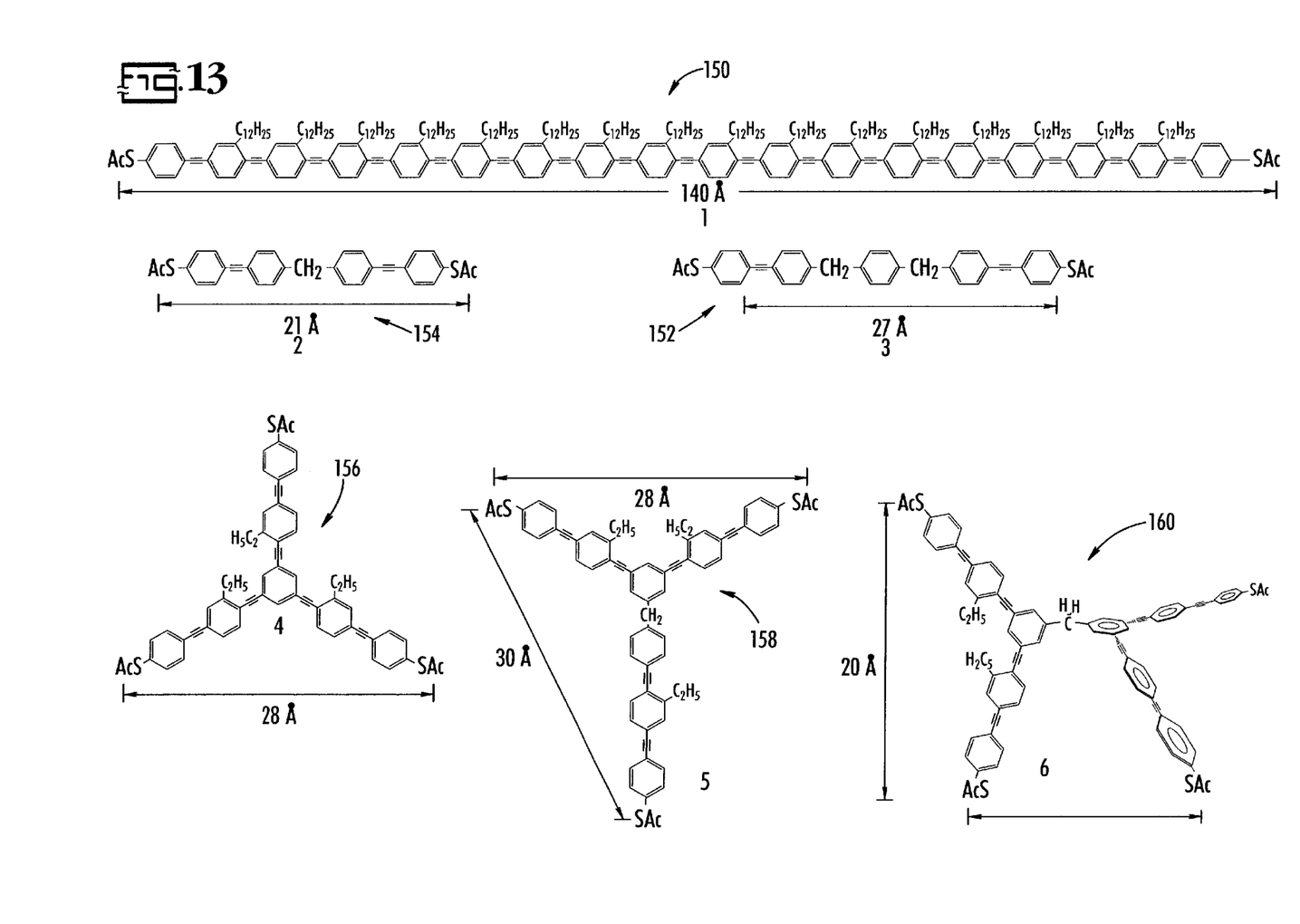
FIG. 13 illustrates two-, three- and four-terminal molecular moleware species, according to a preferred embodiment of the present invention.

Precisely defined molecular architectures including molecular wires 150, wires with tunnel barriers 152, wires with quantum wells 154, three terminal junctions 156, three terminal systems 158 that may act as switches or transistor, and four terminal molecules 160 with strategically-placed tunnel barriers that may act as logic devices are illustrated in FIG. 13. These are embodiments of the more general types of moleware illustrated in FIG. 1B, with molecular wire 30 corresponding to molecular wire 150, wire with tunnel barriers 32 corresponding to wire 152, wire with quantum well 34 corresponding to wire 154, three terminal junction 36 corresponding to junction 156, three terminal switch 38 corresponding to switch 158, and four terminal molecule corresponding to molecule 160. Note that "SAc" indicates a "protected aligator clip", which has an acetyl group that is removed during self-assembly permitting sulfur to form contacts with metal surfaces. The acetyl group is removed by adding a base such as ammonium hydroxide, although it can be removed by the gold surface itself, albeit more slowly.

All of the syntheses have been developed in a convergent fashion in solution or using synthetic methods on a polymer support to streamline the synthetic protocols. Using compounds similar to the wire with two tunnel barriers, we observed negative differential resistance as expected from a resonance tunneling diode. Therefore, precise molecular architecture has been used to build device-like properties into nanoscale systems. Molecules such as those shown can be used in the present molecular computer array.

Described below is a moleware preparation, deposition on a two-dimensional chip platform, and subsequent test of the I/O leads.

Moleware preparation: A solution of octadecyl-terminated single-walled carbon nanotubes (1) was prepared by a slight modification of a procedure by Chen, J. et al. (Chen, J. ; Hamon, M. A.; Hu, H., Chen, Y.; Rao, A.; Ecklund, P. C.; Haddon, R. C. Science 1998, 282, 95–98). To 100 mg of crude single-walled carbon nanotubes (SWNTs, obtained from Tubes@Rice) was added concentrated sulfuric acid/ nitric acid (3:1 v/v, 10 mL). The mixture was sonicated for 4 h (Cole-Parmer, model B3-R) followed by filtration (0.2 micron PTFE) and washing with methanol. To the resulting oxidized SWNTs (14.5 mg) was added thionyl chloride (25 mL, 343 mmol) and dimethylformamide (1 mL). The mixture was sonicated for 0.5 h and heated to 70C. for 24 h. After cooling and centrifugation (Fisher Scientific, Marathon 22 K, 4200 PRM) for 2 min, the solid was collected by filtration and washed with freshly distilled THF and then dried under vacuum (6 mm of Hg) at room temperature. A mixture of the resulting SWNTs (13 mg) and octadecylamine (2 g, 7.4 mmol) was heated to 100C. for 4 days. After cooling to room temperature, the solid was washed with ethanol, sonicated with diethyl ether/hexane (1:1, v/v), collected by centrifugation and filtration and dried under vacuum (6 mm of Hg) at room temperature for 1 h. Some exogenous octadecylamine remained with 1. The resulting 1 could be dissolve in chloroform, tetrahydrofuran, or methylene chloride.

Figure 14:
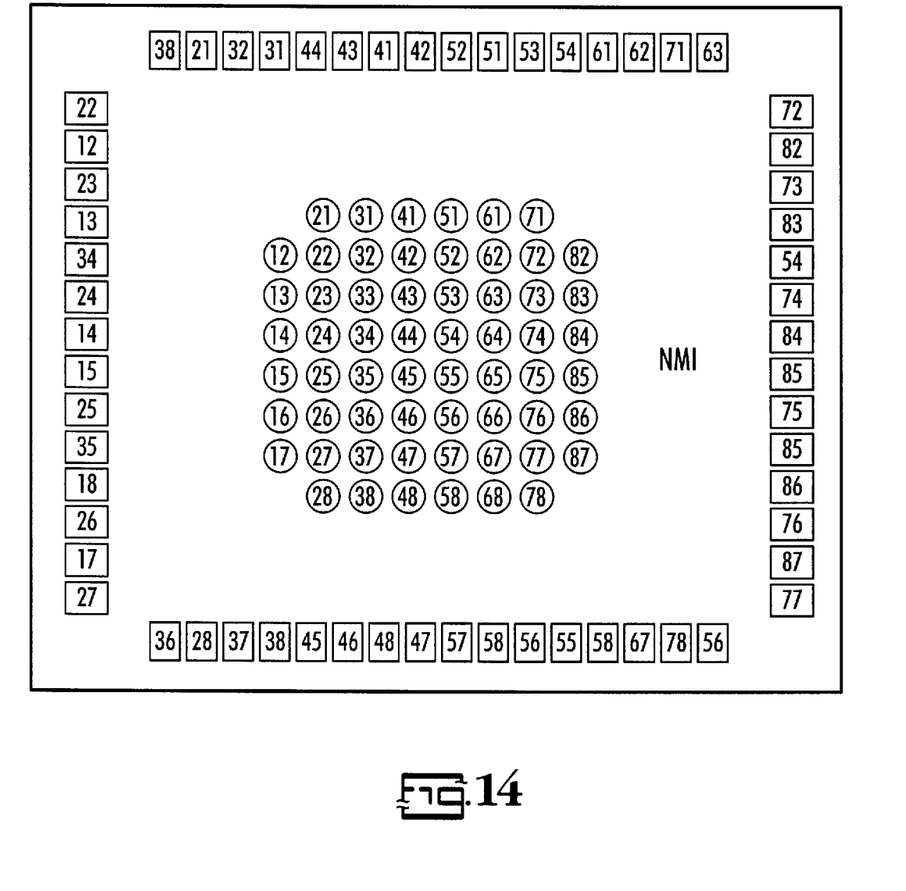
FIG. 14 illustrates a two-dimensional array for a molecular computer according to an example of an embodiment of the present invention.

Moleware Assembly on Chip: An array of 60 gold dot electrodes, as illustrated in FIG. 14, (10 micron diameter per dot, 100 micron pitch distance between dots) had one fourth of the dots exposed (15 dots), the remainder of the dots were coated with titanium dioxide, and hence inactive. Each of the electrode dots was affixed to a bonding pad via a titanium dioxide-coated gold wire. A solution of 1 in chloroform (0.01 w/w) was prepared. A 200-mg portion of the solution of 1 in chloroform was placed over the entire chip. After air drying, the chip was placed under vacuum (6 mm of Hg) at room temperature for 15 min. The deposition was somewhat ragged and the film cracked.

Electrical Measurements on Chip.

The resistance between any two adjacent electrodes was generally below 20 Kohms, typically 12 Kohms, as measured by a multimeter. One electrodes pair had a resistance of ~100 Kohms between them. Zero-bias conductivities of ~10–100 micro Siemens were recorded. I(V) traces (current-voltage) show nonlinearity around zero, and high field saturation. The low bias nonlinearity may be due to the 1—1 junctions, although further characterization would be necessary. The high field noise is higher than at the low field. Using third terminal current injection, the conductivity (between two electrodes) could be modified (remotely, by the third electrode) downward in most cases. This is rather reminiscent of degradation and breakdown. However, occasionally, an increase in conductivity (~2 fold) was noted, with some hysteretic behavior, reminiscent of electrical gain.

It will be apparent to those skilled in the art of nanotechnology and computer architecture that many substitutions and modifications can be made to the preferred embodiments described above without departing from the spirit and scope of the present invention, defined by the following claims.

What is claimed is:

1. A molecular computer made by a process comprising the steps of:
    attaching plural input and output pins to a containment;
    injecting moleware into said containment;
    allowing said moleware to self-assemble, without specifying placement within said containment, said moleware forming a variety of bridges between said input and said output pins;
    applying voltages at said input pins;
    measuring voltages at said output pins; and then
    identifying the non-predetermined relationships between input and output pins when voltages are applied to said input pins until a truth table is constituted for said computer.

2. The molecular computer as recited in claim 1, wherein said moleware is selected from the group consisting of metal particles for interconnecting said moleware, molecular alligator clip-bearing 2-, 3-, and 4-terminal molecular wires, molecular resonant tunneling diodes, carbon nanotubes, molecular switches, molecular resistors, molecular controllers, molecular DRAM and SRAM components composed of molecular controllers or fullerene hybrids, and combinations thereof.

3. The molecular computer as recited in claim 1, wherein said applying step is done by applying said voltage to a bundle of said input pins and said measuring step is done by measuring voltages at a bundle of said output pins.

4. The molecular computer as recited in claim 1, further comprising the step of applying field gradients across said containment to modify said bridges formed by said moleware between said input and said output pins.

5. The molecular computer as recited in claim 1, further comprising the step of electrochemically inducing cross linking of moleware to modify bridges formed by said moleware between said input and said output pins.

6. The molecular computer as recited in claim 1, further comprising the step of eliminating a portion of said bridges formed by said moleware between said input and said output pins.

7. The molecular computer as recited in claim 1, wherein said moleware components are less than 1000 nanometers in diameter.

8. The molecular computer as recited in claim 2, wherein said injecting step is done by injecting each type of moleware separately and at intervals.

9. The molecular computer as recited in claim 1, further comprising the step of installing a support matrix inside said containment prior to injecting said moleware.

10. The molecular computer as recited in claim 1, further comprising the step of varying said voltages applied to said input pins until a desired output at said output pins is achieved.

11. The molecular computer as recited in claim 1, wherein a portion of said moleware includes semiconductor particles coated with molecular control elements adapted to perform memory functions for said molecular computer.

12. The molecular computer as recited in claim 1, wherein said identifying step further comprises the steps of:
    connecting a computer to said input pins and said output pins; and
    using said computer for identifying said relationships.

13. The molecular computer as recited in claim 1, further comprising the step of programming said molecular computer using error resilient software.

14. The molecular computer as recited in claim 1, further comprising the step of synthesizing said moleware in solution before injecting said moleware.

15. The molecular computer as recited in claim 2, wherein said molecular wires are constructed from materials selected from the group of oligo(phenylene ethynylene)s.

16. The molecular computer as recited in claim 15, wherein said molecular wires have termini made of a material selected from thiol, planar oligomer segments or carbon nanotubes or bundles thereof.

17. The molecular computer as recited in claim 15, wherein said molecular wires are selected from the group consisting of carbon nanotubes, planar polyphenylenes, polypyridines, polypyrazines and polythiophenes.

18. The molecular computer as recited in claim 2, wherein said particles are made of a material selected from gold, silver, palladium, platinum and alloys thereof.

19. The molecular computer as recited in claim 1, wherein said solution is a nonaqueous solution.

20. The molecular computer as recited in claim 18, wherein said particles are capped with bifunctional molecular wires.

21. The molecular computer as recited in claim 2, wherein said molecular switches are selected from the group consisting of semiconductor particles having controller molecules on their surfaces and fullerenes.

22. The molecular computer as recited in claim 21, wherein said semiconductor particles are selected from the group consisting of CdS and CdSe.

23. The molecular computer as recited in claim 2, wherein said molecular resistors are made of insulating oxides adapted for connection to metal particles.

24. The molecular computer as recited in claim 23, wherein said insulating oxides are selected from the group consisting of $Al_2O_3$, $TiO_2$, and $SiO_2$.

25. The molecular computer as recited in claim 2, wherein said alligator clips are made of a transition metal attached to a metallic surface.

26. The molecular computer as recited in claim 2, wherein said molecular controllers each have a zwitterionic form that stabilizes in the presence of an applied electromagnetic field.

27. The molecular computer as recited in claim 26, wherein said molecular controllers include biphenylnitroamine.

28. The molecular computer as recited in claim 1, wherein said solution is an organic solvent.

29. The method as recited in claim 1, further comprising the step of adapting said moleware to increase interconnection affinities of said moleware to each other.

30. The method as recited in claim 29, wherein adapting step is selected from the group consisting of capping, functionalizing, activating and combinations thereof.

31. A method of transferring data from an input to an output, said method comprising the steps of:

establishing a variety of non-predetermined molecular bridges composed of molecules that self-assemble without specifying placement of said molecules between an input and an output; said molecules including a first molecule connected to said input; and applying a voltage to said input sufficient to modify the molecular electrostatic potential of a first molecule.

32. The method as recited in claim 31, further comprising the step of adapting said molecules to increase interconnection affinities of said molecules to each other.

33. The method as recited in claim 32, wherein adapting step is selected from the group consisting of capping, functionalizing, activating and combinations thereof.

* * * * *